(12) United States Patent
Yamate et al.

(10) Patent No.: US 10,915,393 B2
(45) Date of Patent: Feb. 9, 2021

(54) SEMICONDUCTOR DEVICE AND FAILURE DETECTION SYSTEM

(71) Applicant: RENESAS ELECTRONICS CORPORATION, Tokyo (JP)

(72) Inventors: Akihiro Yamate, Tokyo (JP); Yoshitaka Taki, Tokyo (JP); Tatsuya Kamei, Tokyo (JP); Yoichi Yuyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 214 days.

(21) Appl. No.: 16/128,342

(22) Filed: Sep. 11, 2018

(65) Prior Publication Data
US 2019/0155680 A1    May 23, 2019

(30) Foreign Application Priority Data
Nov. 20, 2017   (JP) ................ 2017-222695

(51) Int. Cl.
*G06F 11/07*   (2006.01)
*G11C 29/52*   (2006.01)
(Continued)

(52) U.S. Cl.
CPC ........ *G06F 11/0793* (2013.01); *G06F 11/079* (2013.01); *G06F 11/0724* (2013.01); *G06F 11/0727* (2013.01); *G06F 11/0751* (2013.01); *G06F 11/0766* (2013.01); *G06F 11/1068* (2013.01); *G06F 11/1641* (2013.01);
(Continued)

(58) Field of Classification Search
CPC combination set(s) only.
See application file for complete search history.

(56) References Cited

U.S. PATENT DOCUMENTS 5,991,900 A * 11/1999 Garnett ............... G06F 13/4027
714/3
6,173,351 B1 * 1/2001 Garnett ............... G06F 11/1658
710/309

(Continued)

OTHER PUBLICATIONS

Extended European Search Report issued in corresponding European Patent Application No. 18206256.2-1221, dated Apr. 15, 2019.

*Primary Examiner* — Amine Riad
(74) *Attorney, Agent, or Firm* — McDermott Will & Emery LLP

(57) ABSTRACT

Existing semiconductor devices cannot detect a failure occurring in a circuit required for mode switching processing for other than arithmetic cores, so that reliability is inadequate. A semiconductor device of an embodiment of the invention includes: a selector which is provided corresponding to among plural arithmetic cores one used as a checking arithmetic core in lock-step mode and which, in lock-step mode, blocks the interface signals outputted from the corresponding arithmetic core and, in split mode, lets the interface signals outputted from the corresponding arithmetic core through; an access monitor which monitors the interface signals outputted via a selector and, when an abnormal state of the interface signals is detected, outputs an error signal; and an error control unit which outputs, based on the error signal outputted from the access monitor, an abnormal state processing request to a higher-order system.

12 Claims, 12 Drawing Sheets

(51) Int. Cl.
*G11C 29/38* (2006.01)
*G06F 11/10* (2006.01)
*G06F 11/16* (2006.01)
*G06F 11/30* (2006.01)

(52) U.S. Cl.
CPC .......... *G06F 11/3055* (2013.01); *G11C 29/38* (2013.01); *G11C 29/52* (2013.01)

(56) References Cited

U.S. PATENT DOCUMENTS

| | | | |
|---|---|---|---|
| 7,107,484 B2* | 9/2006 | Yamazaki | G06F 1/12 |
| | | | 711/E12.026 |
| 7,225,355 B2* | 5/2007 | Yamazaki | G06F 11/1687 |
| | | | 713/375 |
| 8,051,323 B2 | 11/2011 | Pathirane et al. | |
| 2002/0065986 A1* | 5/2002 | Jeffrey | G06F 11/1658 |
| | | | 711/117 |
| 2003/0041290 A1* | 2/2003 | Peleska | G05B 19/0428 |
| | | | 714/47.1 |
| 2003/0182492 A1* | 9/2003 | Watkins | G06F 11/1641 |
| | | | 711/5 |
| 2004/0019771 A1* | 1/2004 | Quach | G06F 11/1658 |
| | | | 712/229 |
| 2004/0225792 A1* | 11/2004 | Garnett | G06F 11/006 |
| | | | 710/300 |
| 2011/0179255 A1* | 7/2011 | Pathirane | G06F 1/24 |
| | | | 712/207 |
| 2011/0179308 A1* | 7/2011 | Pathirane | G06F 11/073 |
| | | | 714/37 |
| 2011/0179309 A1* | 7/2011 | Pathirane | G06F 11/3648 |
| | | | 714/37 |
| 2016/0034368 A1 | 2/2016 | Nishii et al. | |

\* cited by examiner

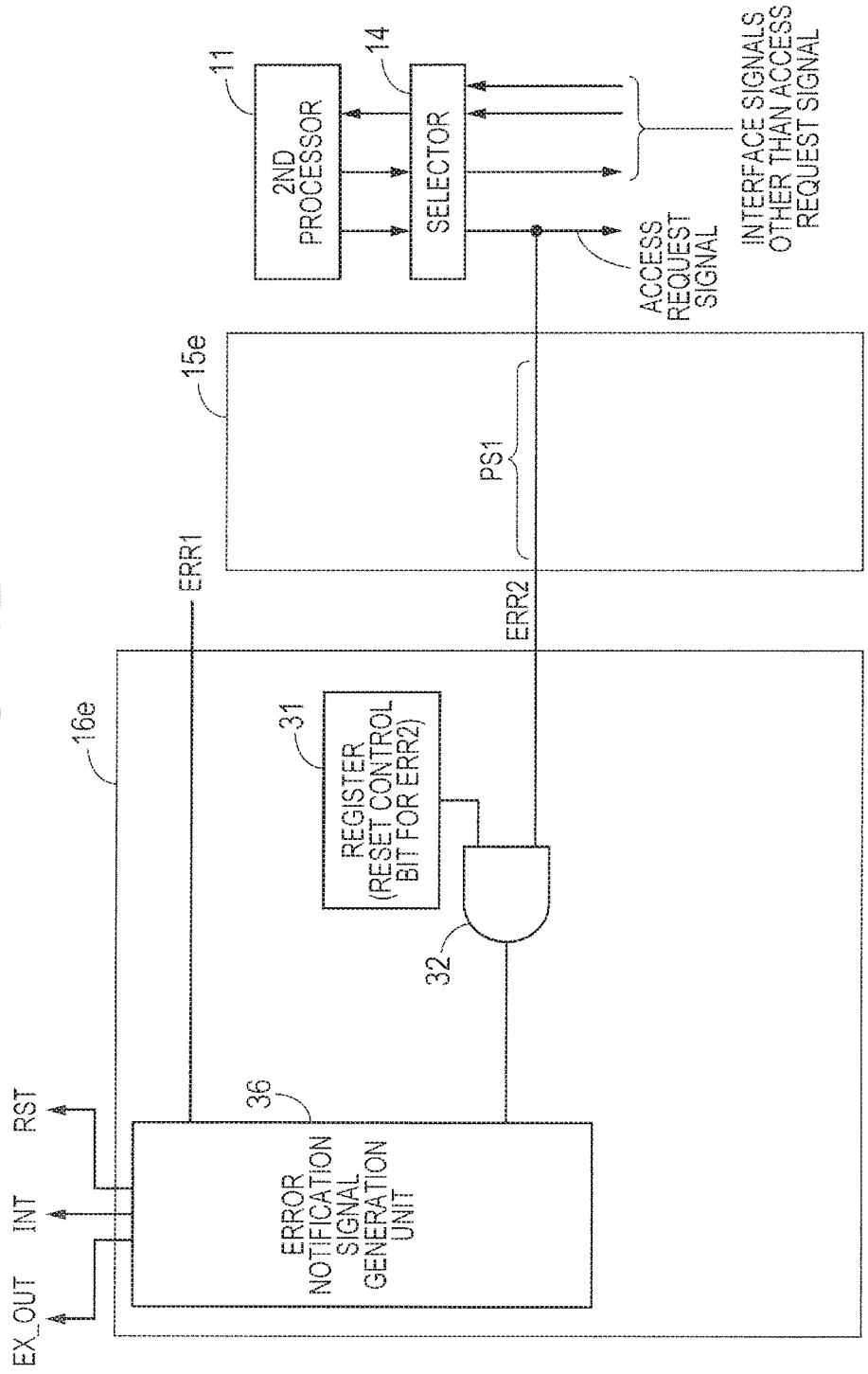

SEMICONDUCTOR DEVICE AND FAILURE DETECTION SYSTEM

CROSS-REFERENCE TO RELATED APPLICATIONS

The disclosure of Japanese Patent Application No. 2017-222695 filed on Nov. 20, 2017 including the specification, drawings and abstract is incorporated herein by reference in its entirety.

BACKGROUND

The present invention relates to a semiconductor device, for example, a semiconductor device including plural processors and having two operation modes, i.e., clock-step mode in which plural processors identically operate and split mode in which plural processors differently operate.

Recently, among the semiconductor devices including an arithmetic core for executing programs, there are those realizing, by using plural internal arithmetic cores, reliability improvement and processing capacity enhancement. Such semiconductor devices include those which have two operation modes, i.e., lock-step mode in which plural arithmetic cores operate identically to obtain a same operation result and split mode in which plural arithmetic cores are differently operated. In U.S. Pat. No. 8,051,323, a semiconductor device capable of switching between the lock-step mode and the split mode is disclosed.

SUMMARY

In the semiconductor device disclosed in U.S. Pat. No. 8,051,323, however, when a failure occurs in the lock-step mode, a checking arithmetic core may cause unintended access to an internal memory or a peripheral circuit. When such a failure occurs, the arithmetic core that has been functioning as a checking arithmetic core may become unable to access, in split mode, the internal memory or the peripheral circuit. That is, the semiconductor device disclosed in U.S. Pat. No. 8,051,323 cannot detect a failure occurring in a circuit required for mode switching processing for other than arithmetic cores, and this poses a reliability problem.

Other objects and novel features of the present invention will become apparent from the following description of this specification and the attached drawings.

According to an embodiment of the present invention, a semiconductor device includes: a selector which is provided corresponding to, out of plural arithmetic cores, one used as an arithmetic core for checking in lock-step mode and which, in lock-step mode, blocks the interface signals outputted from the corresponding arithmetic core and, in split mode, lets the interface signals outputted from the corresponding arithmetic core through; an access monitor which monitors the interface signals outputted via the selector and, when an abnormal state of the interface signals is detected, outputs an error signal; and an error control unit which outputs, based on the error signal outputted from the access monitor, an abnormal state processing request to a higher-order system.

According to an embodiment of the present invention, a semiconductor device can detect a failure occurring in a circuit required for mode switching processing for other than arithmetic cores.

BRIEF DESCRIPTION OF THE DRAWINGS

FIG. 12 is a block diagram showing an access monitor and an error control unit according to the seventh embodiment.

DETAILED DESCRIPTION

Figure 1:
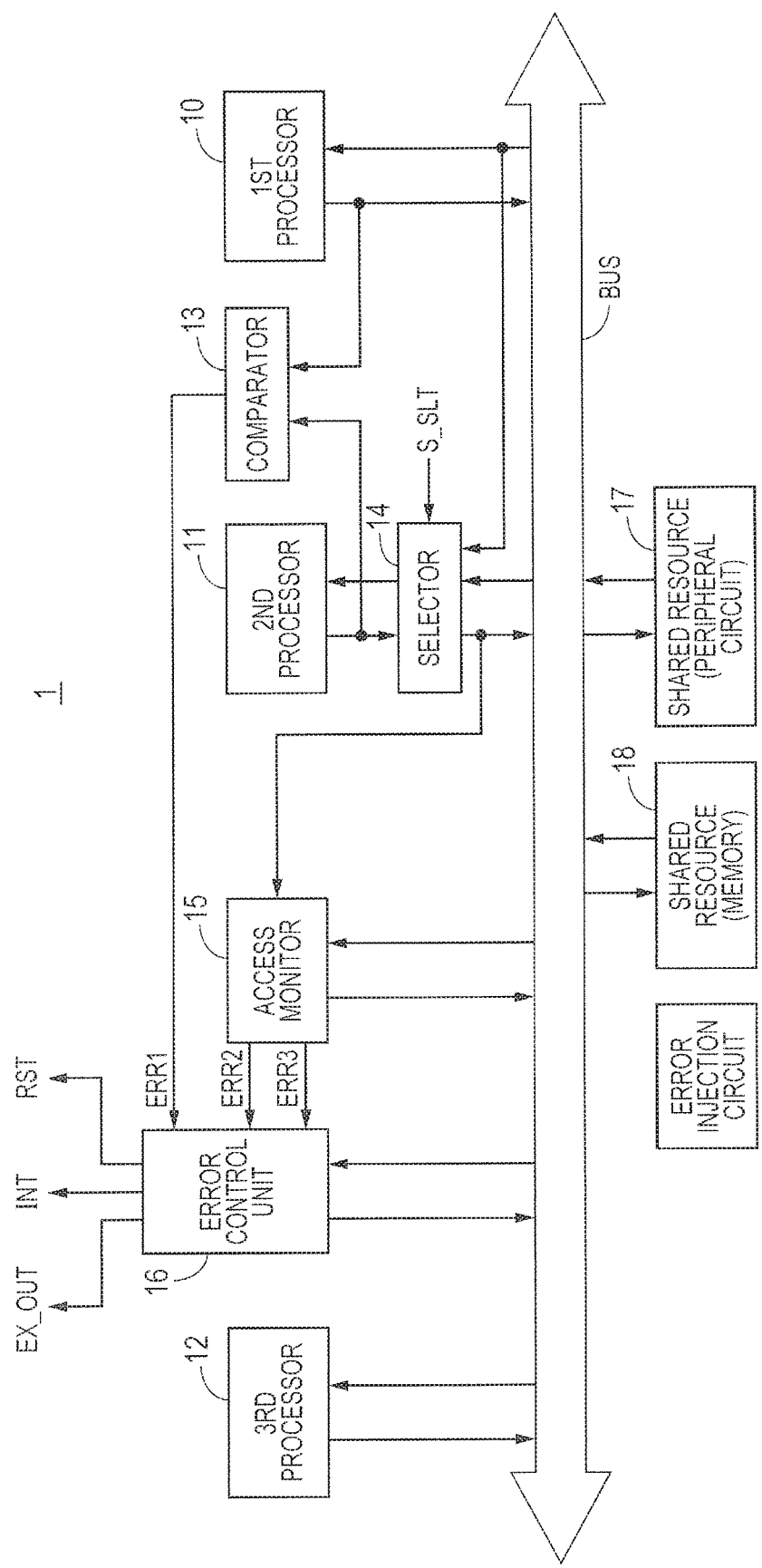
FIG. 1 is a block diagram of a semiconductor device 1 according to a first embodiment of the present invention.

The following description and the drawings referred to in the following include omissions and simplification as appropriate to make description clear. Also, elements represented in drawings as function blocks to perform various processing can be realized hardware-wise with a CPU, a memory and other circuits or software-wise with, for example, programs loaded in memory. Therefore, it will be understood by those skilled in the art that such function blocks can be realized in various ways, for example, by hardware means only or by software means only or by combining hardware means and software means without being limited to any particular means. Also, in the drawings referred to in the following, identical elements are denoted by identical numerals and symbols and, in the description, descriptive duplication is avoided as appropriate.

The programs mentioned above can be stored using non-transitory computer-readable media and can be supplied to computers. Non-transitory computer-readable media include various types of tangible storage media and may be, for example, magnetic recording media (e.g., flexible disks, magnetic tapes and hard disk drives), magneto-optical media (e.g., magneto-optical disks), CD-ROMs (Read Only Memories), CD-Rs, CD-R/Ws, semiconductor memories (e.g., mask ROMs, PROMs (Programmable ROMs), EPROMs (Erasable PROMs), flash ROMs, and RAMs (Random Access Memories). The programs may be supplied to computers using various types of transitory computer-readable media. The transitory computer-readable media include, for example, electric signals, optical signals, and electromagnetic waves. The transitory computer-readable media can be used to supply programs to computers via wired communication channels such as electric wires and optical fibers or via radio channels.

First Embodiment

FIG. 1 is a block diagram of a semiconductor device 1 according to a first embodiment of the present invention. As shown in FIG. 1, the semiconductor device 1 includes plural arithmetic cores each for program execution. The semiconductor device 1 of the first embodiment has two operation modes, lockstep mode for operating plural arithmetic cores to obtain a same arithmetic operation result from the respective arithmetic cores and split mode for operating plural arithmetic cores independently. In the lockstep mode, a first arithmetic core is used for main arithmetic processing and a second arithmetic core is used as a checking arithmetic core for monitoring the operation of the first arithmetic core. That is, in lock-step mode, based on the difference, if any, between the results of arithmetic operations performed by the two arithmetic cores, an arithmetic core failure can be detected early. This enhances the reliability of operation results. In split mode, on the other hand, plural arithmetic cores execute respective programs, so that an increased number of programs can be executed in parallel for high-speed processing.

As shown in FIG. 1, the semiconductor device 1 of the first embodiment includes a first arithmetic core (e.g., a first processor 10), a second arithmetic core (e.g., a second processor 11), a third processor 12, a comparator 13, a selector 14, an access monitor 15, an error control unit 16, and shared resources 17 and 18. The shared resources 17 and 18 are peripheral circuits which include, for example, a memory, a timer-I/O interface circuit, an analog-digital converter and a digital-analog converter. The shared resources are hardware resources shared by the first to third processors 10 to 12. In the example shown in FIG. 1, the shared resource 17 is a memory and the shared resource 18 is a hardware resource (e.g., a peripheral circuit) other than memory.

The first processor 10, second processor 11 and third processor 12 are arithmetic cores for executing programs. The semiconductor device 1 of the first embodiment shown in FIG. 1 uses, in lock-step mode, the first processor 10 as a main arithmetic core and the second processor 11 as an arithmetic core for checking the operation of the main arithmetic core. The arithmetic cores to output a same arithmetic operation result in lock-step mode preferably have a same circuit configuration, but they may have different circuit configurations between them. In split mode, the semiconductor device 1 of the first embodiment shown in FIG. 1 makes the first processor 10, second processor 11 and third processor 12 respectively execute programs.

As shown in FIG. 1, in the semiconductor device 1 of the first embodiment, the first processor 10, second processor 11, third processor 12, access monitor 15, error control unit 16, and shared resources 17 and 28 are configured such that they can engage in communication via a system bus. Note that the second processor 11 is coupled to the system bus via the selector 14.

The comparator 13 compares a first group of interface signals outputted from the first processor 10 to the shared resources 17 and 18 and a second group of interface signals outputted from the second processor 11 to the shared resources 17 and 18. When, as a result of the comparison, it is found that the first interface-signal group and the second interface-signal group do not agree, the comparator 13 enables a first error signal ERR1. The interface signals monitored by the comparator 13 may be a portion (e.g., data signals only) of the interface signals included in each of the first and second interface-signal groups.

The selector 14 makes switching, based on a split mode enable signal S_SLT, as to whether to send the interface signals outputted from the second processor 11 to the system bus BUS. The selector 14 also makes switching, based on the split mode enable signal S_SLT, as to which to supply to the second processor 11 a group of interface signals addressed to the second processor 11 and received from the system bus BUS or a group of interface signals addressed to the first processor 10 and received from the system bus BUS.

To be specific, in a state with the lock-step mode specified by the split mode enable signal S_SLT, the selector 14 prevents the second group of interface signals outputted from the second processor 11 from being outputted to the system bus BUS. Also, when in lock-step mode, the selector 14 selects, out of the second group of interface signals addressed to the second processor 11 and received from the system bus BUS and the first group of interface signals addressed to the first processor 10 and received from the system bus BUS, the first group of interface signals and sends the selected first group of interface signals to the second processor 11.

In a state with the split mode specified by the split mode enable signal S_SLT, the selector 14 outputs the second group of interface signals outputted from the second processor 11 to the system bus BUS. Also, when in split mode, the selector 14 selects, out of the second group of interface signals addressed to the second processor 11 and received from the system bus BUS and the first group of interface signals addressed to the first processor 10 and received from the system bus BUS, the second group of interface signals and sends the selected second group of interface signals to the second processor 11.

The access monitor 15 checks for output via the selector 14 of the second group of interface signals to the system bus BUS and, when the second group of interface signals are outputted to the system bus BUS, outputs a second error signal ERR2. When the second group of interface signals are not outputted over a certain period of time, the access monitor 15 outputs a third error signal ERR3. The access monitor 15 will be described in detail later.

The error control unit 16 detects, based on the first error signal ERR1, second error signal ERR2 or third error signal ERR3, an abnormal state of the first processor 10 or the second processor 11 or the selector 14. Based on the detected abnormal state, the error control unit 16 outputs an abnormal state processing request to request a higher-order system to perform processing corresponding to the abnormal state. In the example shown in FIG. 1, the error control unit 16 outputs, as a signal to request abnormal state processing, an external error notification signal EX_OUT or an error interrupt signal INT or a reset request signal RST. The error control unit 16 will be described in detail later.

Figure 2:
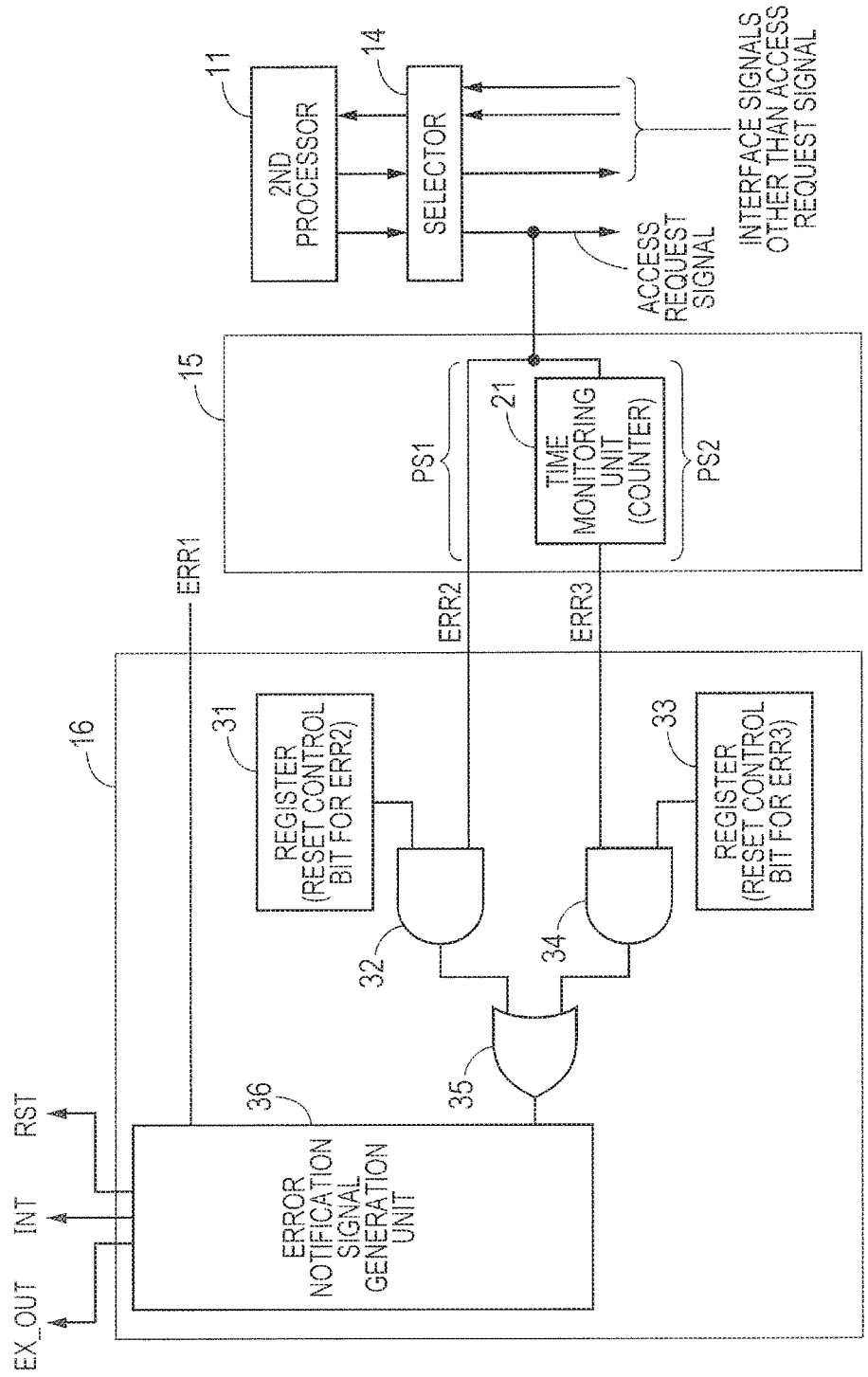
FIG. 2 is a block diagram showing an access monitor and an error control unit according to the first embodiment.

Next, the access monitor 15 and the error control unit 16 will be described in detail. FIG. 2 is a block diagram showing the access monitor 15 and the error control unit 16 according to the first embodiment. The second processor 11 and the selector 14 are also shown in FIG. 2 for use in describing the signals handled by the access monitor 15 and the error control unit 16.

As shown in FIG. 2, in the semiconductor 1 of the first embodiment, out of the second group of interface signals inputted to or outputted from the second processor 11 (hereinafter may also be referred to simply as "interface signals"), only an access request signal is made a target of error detection processing by the access monitor 15 and the error control unit 16. This is because, with the access request signal being a signal having a known value, the access monitor 15 and the error control unit 16 can easily determine the signal value.

As shown in FIG. 2, the access monitor 15 has a first path PS1 and a second path PS2. The second path PS2 includes a time monitoring unit (counter) 21. The first path PS1 is a signal path used to output the value of a signal being monitored (i.e., the access request signal according to the first embodiment) out of the second group of interface signals without any change as the second error signal ERR2 to the error control unit 16. The time monitoring unit 21 detects a change in the access request signal, counts a predetermined amount of time from when the signal change is detected and, upon elapse of the predetermined amount of time, changes the logic level of the output signal (e.g., the third error signal ERR3). The time monitoring unit 21 may be, for example, a counter. That is, the second path PS2 makes the counter operate based on the value of a signal made a target of monitoring (e.g., the access request signal) included in the second group of interface signals and outputs the third error signal ERR3 whose logic level changes when the counter overflows to the error control unit 16. The counter value to cause the time monitoring unit 21 (e.g., a counter) to overflow is supplied from the first processor 10 or another processor via the system bus BUS.

Figure 3:
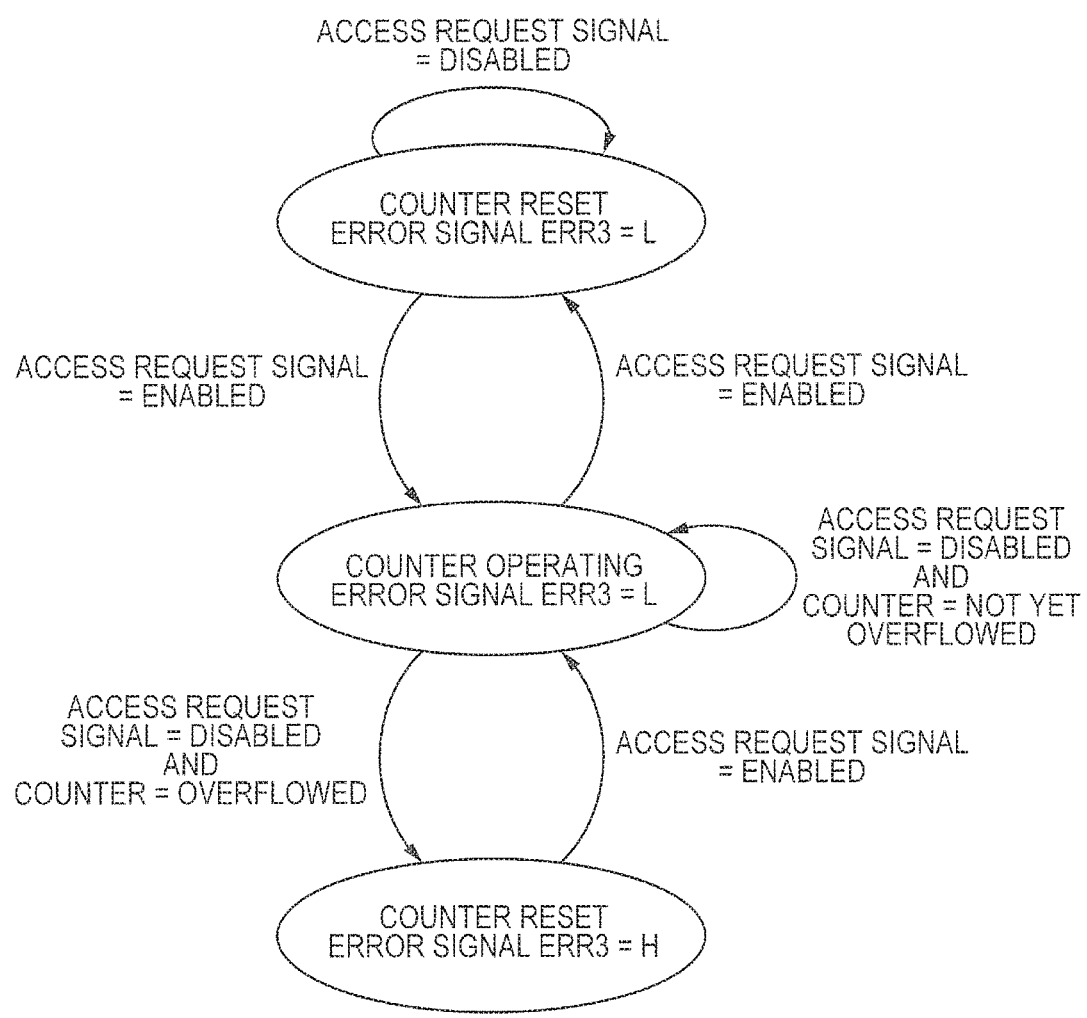
FIG. 3 is a diagram illustrating state transitions of a time monitoring unit according to the first embodiment.

The semiconductor device 1 of the first embodiment has a characteristic in the operation of the time monitoring unit 21. The operation of the time monitoring unit 21 is described in detail below. FIG. 3 is a diagram illustrating state transitions of the time monitoring unit 21 of the first embodiment. In the example of state transitions illustrated in FIG. 3, the signal monitored is the access request signal.

In an initial state immediately after a start-up of the semiconductor device 1 of the first embodiment, the access request signal is in a disabled state, the counter is in a reset state, and the third error signal ERR3 is at a low level (denoted as "L" in FIG. 3). Hence, the time monitoring unit 21 starts operation from the topmost transition state shown in FIG. 3. The time monitoring unit 21 remains in the reset state as long as the access request signal is in a disabled state. When the access request signal changes from the disabled state to an enabled state, the time monitoring unit 21 activates the counter. Subsequently, when the access request signal changes from the enabled state to a disabled state, the time monitoring unit 21 starts counting the time the access request signal remains disabled.

Subsequently, while keeping the error signal ERR3 low, the time monitoring unit 21 increments the count until the counter overflows. If, while the counter is operated by the time monitoring unit 21, the access request signal in the disabled state is enabled, the time monitoring unit 21 resets the counter again and changes the error signal ERR3 to a low level. If, with the access request signal remaining disabled, the counter overflows, the time monitoring unit 21 changes the third error signal ERR3 at a low level to a high level. When the access request signal in the disabled state is enabled again, the time monitoring unit 21 restores the initial state.

As described above, when, for any reason, the access request signal is fixed in a disabled state while the semiconductor device 1 is operating in split mode, the access monitor 15 having the time monitoring unit 21 notifies the error state to the error control unit 16 by means of the error signal ERR3.

The error control unit 16 includes a first register (e.g., register 31), an AND circuit 32, a second register (e.g., register 33), an AND circuit 34, an OR circuit 35, and an error notification signal generation unit 36. The register 31 stores a first error value (e.g., a reset control bit for the second error signal ERR2) for notifying an error state indicated by the second error signal ERR2. The register 33 stores a second error value (e.g., a reset control bit for the third error signal ERR3) for notifying an error state indicated by the third error signal ERR3. The values to be stored in the registers 31 and 33 are supplied from the first processor 10 or another processor via the system bus BUS.

When the second error signal ERR2 indicates an error state (e.g., at high level), the AND circuit 32 outputs the value of the reset control bit for resetting the second error signal ERR2 that is stored in the register 31. When the third error signal ERR3 indicates an error state (e.g., at high level), the AND circuit 34 outputs the value of the reset control bit for resetting the third error signal ERR3 that is stored in the register 33.

When at least one of the output signals of the AND circuits 32 and 34 becomes active (e.g., set to high level), the OR circuit 35 changes the logic level of its output signal from low to high. When the first error signal ERR1 and the output signal of the OR circuit 35 become active (e.g., set to high level), the error notification signal generation unit 36 outputs an abnormal state processing request. That is, the error notification signal generation unit 36 includes the first register (register 31) storing a value assumed for the second error signal ERR2 and the second register (register 33) storing a value assumed for the third error signal ERR3 and, when the value stored in the first register is inputted as the second error signal ERR2 or when the value stored in the second register is inputted as the third error signal ERR3, outputs an abnormal state processing request.

The error notification signal generation unit 36 may change the contents of the abnormal state processing request depending on the error made known. For example, when an error notification is given by the first error signal ERR1, the error notification signal generation unit 36 may output an abnormal state processing request requesting a higher-order system to stop operation in lock-step mode and, when an error notification is given by the second error signal ERR2 or the third error signal ERR3 (i.e., an output signal of the OR circuit 35), the error notification signal generation unit 36 may output an abnormal state processing request requesting a higher-order system to stop operation in lock-step mode and, at the same time, to prohibit using the second processor 11.

Next, the operation of the semiconductor device 1 of the first embodiment will be described. As stated in the foregoing, the semiconductor device 1 of the first embodiment has two operation modes, lock-step mode and split mode. Therefore, in the following, the operation in lock-step mode and the operation in split mode of the semiconductor device 1 of the first embodiment will be described separately.

First, the operation in lock-step mode of the semiconductor device 1 of the first embodiment will be described. In lock-step mode, the split mode enable signal S_SLT assumes a value indicating a disabled state (e.g., a value indicating the lock-step mode, that is, a high level). This causes the selector 14 to block the second group of interface signals outputted from the second processor 11 and to supply the first group of interface signals addressed to the first processor 10 and received via the system bus BUS to the second processor 11. That is, in lock-step mode, the interface signals outputted from the selector 14 assume a fixed value (e.g., a low level). Therefore, in lock-step mode, a signal inputted to the access monitor 15 as a target of monitoring (e.g., an access request signal) is fixed at low level (disabled state) and the second error signal ERR2 is kept in a disabled state (e.g., at low level).

However, when the selector 14 fails or a failure occurs causing the split mode enable signal S_SLT to be fixed in an enabled state (e.g. at high level), the selector 14 can no longer block the second group of interface signals outputted from the second processor 11 and, as a result, the second group of interface signals are outputted to the system bus BUS. When a failure like the above-described occurs, the state of the access request signal supplied to the access monitor 15 changes. In the semiconductor device 1 of the first embodiment, when the state of the access request signal changes, the second error signal ERR2 changes to a high level and the error control unit 16 outputs an abnormal state processing request.

When a failure as described above occurs in lock-step mode, the second processor 11 operates erroneously in split mode and makes write access to the shared resources 17 and 18. This leads to unintended successive FIFO accessing and results in incorrect operation to cause a problem. In the case of read access, such a failure causes the first processor 10 and the second processor 11 to operate differently and the comparator can detect the difference. Furthermore, when a failure as described above occurs, the number of times of access to the shared resources 17 and 18 doubles resulting in lower bus performance. This may cause a problem that a requirement concerning a system control cycle cannot be met.

In the semiconductor device 1 of the first embodiment, however, the above-described failure is detected by the access monitor 15 and the error control unit 16 and processing to prevent ensuing erroneous operation is performed in a higher-order system, so that the effect of the failure is minimized.

Next, the operation in split mode of the semiconductor device 1 of the first embodiment will be described. In split mode, the split mode enable signal S_SLT assumes a value to indicate an enabled state (e.g., a value indicating a split mode, that is, a low level). This causes the selector 14 to output the second group of interface signals outputted from the second processor 11 to the system bus BUS and supply the second group of interface signals addressed to the second processor 11 and inputted from the system bus BUS to the second processor 11. That is, in split mode, the interface signals outputted from the selector 14 vary. Therefore, in split mode, the access monitor 15 receives a monitoring target signal (e.g., an access request signal) of a varying value and the error signal ERR3 remains in a disabled state (e.g., at low level).

However, when the selector 14 fails or when a failure to cause the split mode enable signal S_SLT to be fixed in a disabled state (e.g., at low level) occurs, the selector 14 blocks the second group of interface signals outputted from the second processor 11. When a failure like this occurs, the access request signal supplied to the access monitor 15 is fixed in a disabled state (e.g., at low level). In the semiconductor device 1 of the first embodiment, in split mode, the access request signal is fixed in a disabled state causing the third error signal ERR3 to change to high level and the error control unit 16 to output an abnormal state processing request.

When the above failure occurs in split mode, the selector 14 operates erroneously in lock-step mode and causes a problem in which the second processor 11 becomes unable to access the shared resources 17 and 18. In the semiconductor device 1 of the first embodiment, the above failure is detected by the access monitor 15 and the error control unit 16 and processing to prevent ensuing erroneous operation is performed in a higher-order system, so that the effect of the failure is minimized.

When no failure occurs, the third error signal ERR3 remains, in lock-step mode, in an error notifying state and, in split mode, the second error signal ERR2 remains in an error notifying state. The error notifying states are not due to any failure. It is, therefore, necessary to treat them as pseudo error indications not to cause higher-order systems to determine that a failure has occurred. As measures against such pseudo-error indications, it is necessary to arrange the setting of the error control unit 16 (e.g., of the error notification signal generation unit 36) so as to prevent reset requests, interrupt requests and outputs from terminals from being made based on pseudo-error indications. Such setting of the error control unit 16 is preferably done by the independent third processor 12.

As described above, in the semiconductor device 1 of the first embodiment, it is possible to detect failures concerning the selector 14 and the split mode enable signal S_SLT that cannot be detected only by processor-operation monitoring by the comparator 13 and to perform processing to deal with the detected failures caused in lock-step mode.

Also, in the semiconductor device 1 of the first embodiment, the access monitor 15 can detect, in split mode, failures concerning the selector 14 and the split mode enable signal S_SLT, so that it is possible to deal with failures occurring in split mode.

Thus, in the semiconductor device 1 of the first embodiment, failures concerning the selector 14 and the split mode enable signal S_SLT that cannot be detected only by processor-operation monitoring can be detected and the detected failures can be dealt with.

Second Embodiment

As a second embodiment of the present invention, a semiconductor device 2 different from the semiconductor device 1 of the first embodiment will be described. In describing the second embodiment, constituent elements identical to those described in connection with the first embodiment will be denoted by numerals and symbols identical to those used in connection with the first embodiment and description of such constituent elements will be omitted.

Figure 4:
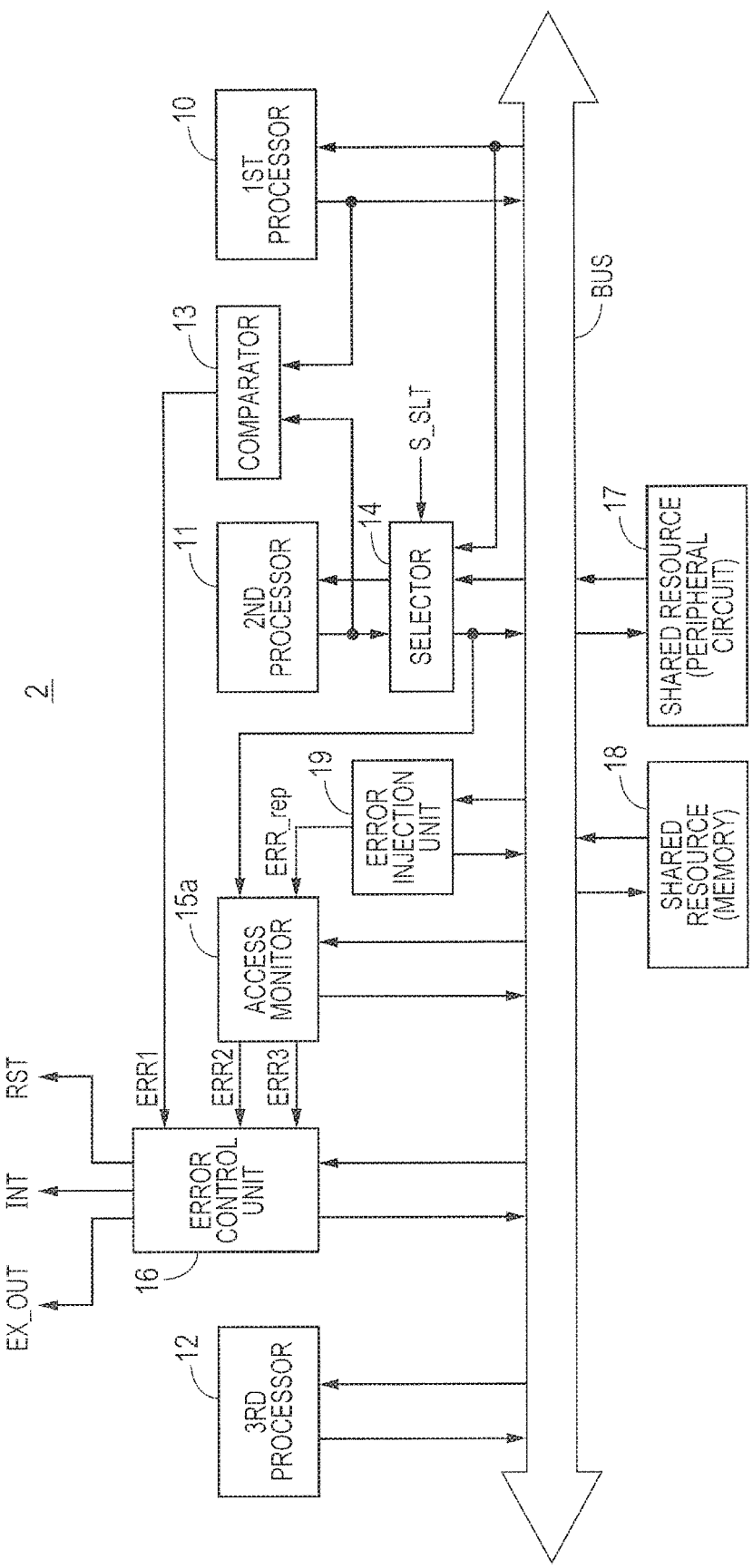
FIG. 4 is a block diagram of a semiconductor device according to a second embodiment of the present invention.
Figure 5:
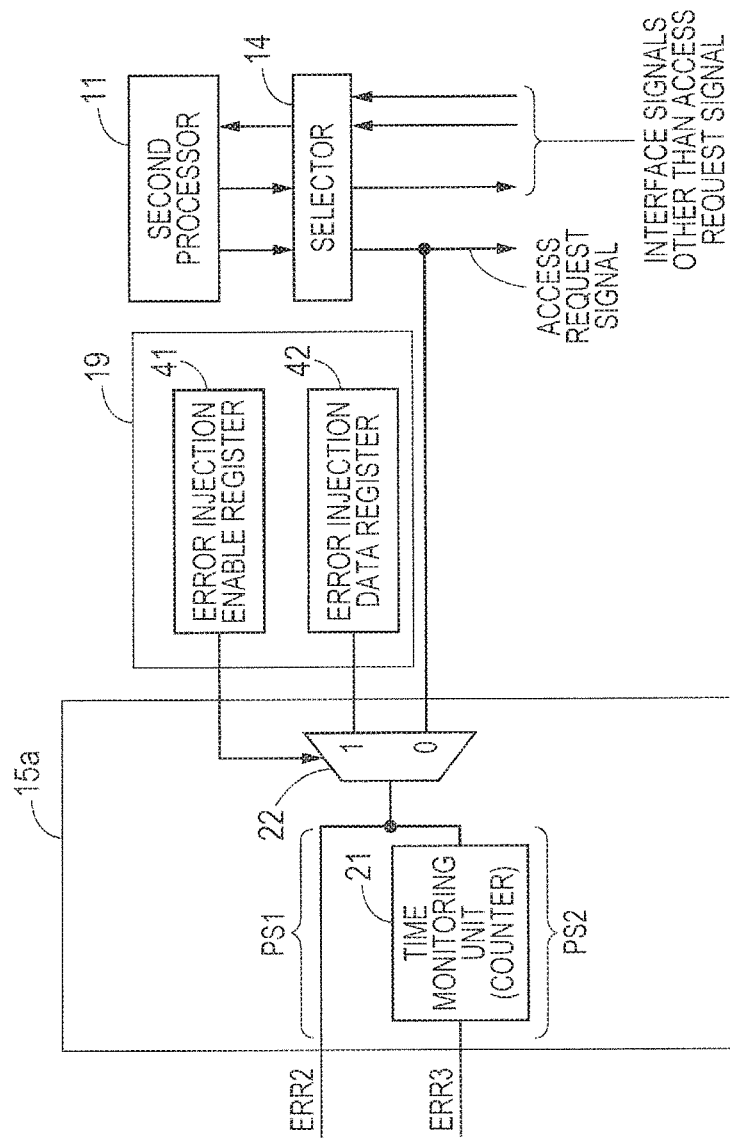
FIG. 5 is a block diagram showing an error injection unit and an access monitor according to the second embodiment.

FIG. 4 is a block diagram of a semiconductor device 2 according to the second embodiment of the present invention. As shown in FIG. 4, the semiconductor device 2 is equivalent to the semiconductor device 1 of the first embodiment with the access monitor 15 replaced by an access monitor 15a and with an error injection unit 19 additionally provided. Hence, in the following, the access monitor 15a and the error injection unit 19 will be described in detail. FIG. 5 is a block diagram showing the error injection unit 19 and the access monitor 15a of the second embodiment.

As shown in FIG. 5, the access monitor 15a is equivalent to the access monitor 15 added with a selector 22. The error injection unit 19 includes an error injection enable register 41 and an error injection data register 42. The error injection enable register 41 stores a value (e.g., error data) of the monitoring target signal based on which the error control unit outputs an abnormal state processing request. The error injection data register 42 stores a switching setting value for determining whether or not to input the value stored in the error injection data register 42 to the first path PS1 and the second path PS2. The selector 22 selects, according to the switching setting value, either one of the value stored in the error data injection register 42 and the monitoring target signal and outputs the selection to the first path and the second path. The switching setting value stored in the error injection enable register 41 and the value stored in the error injection data register 42 are provided by the first processor 10 or the third processor 12.

In the semiconductor device 2 of the second embodiment including the access monitor 15a and the error injection unit 19, whether or not the access monitor 15a and the error control unit are correctly operating can be checked. That is, the semiconductor device 2 of the second embodiment can detect a failure of not only the selector 14 but also the access monitor 15a and the error control unit 16, so that the semiconductor device 2 can ensure higher reliability than the semiconductor device 1 of the first embodiment.

Third Embodiment

As a third embodiment of the present invention, a semiconductor device 3 different from the semiconductor device 2 of the second embodiment will be described. In describing the third embodiment, constituent elements identical to those described in connection with the first and second embodiments will be denoted by numerals and symbols identical to those used in connection with the first and second embodiments and description of such constituent elements will be omitted.

Figure 6:
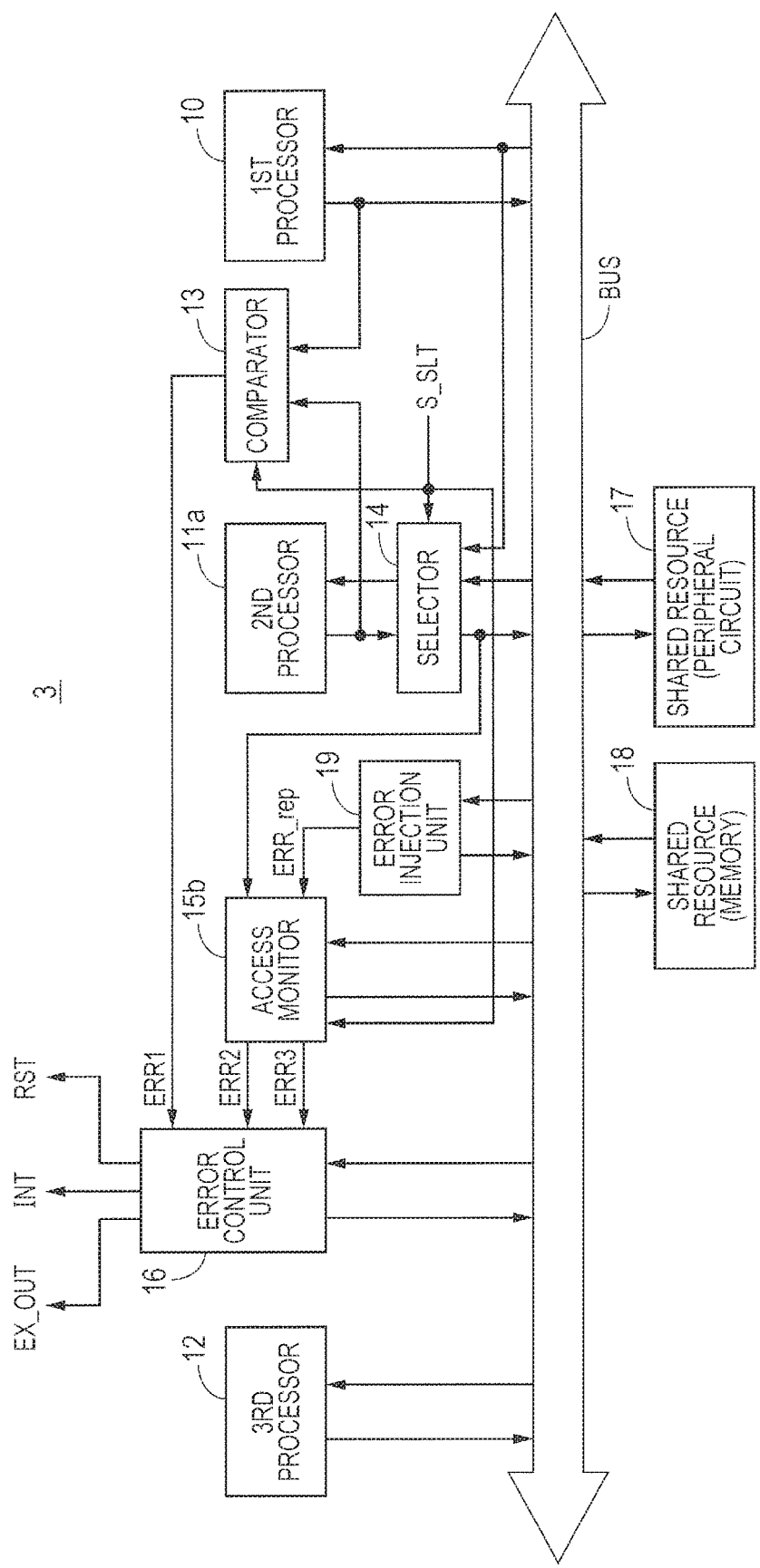
FIG. 6 is a block diagram of a semiconductor device according to a third embodiment of the present invention.
Figure 7:
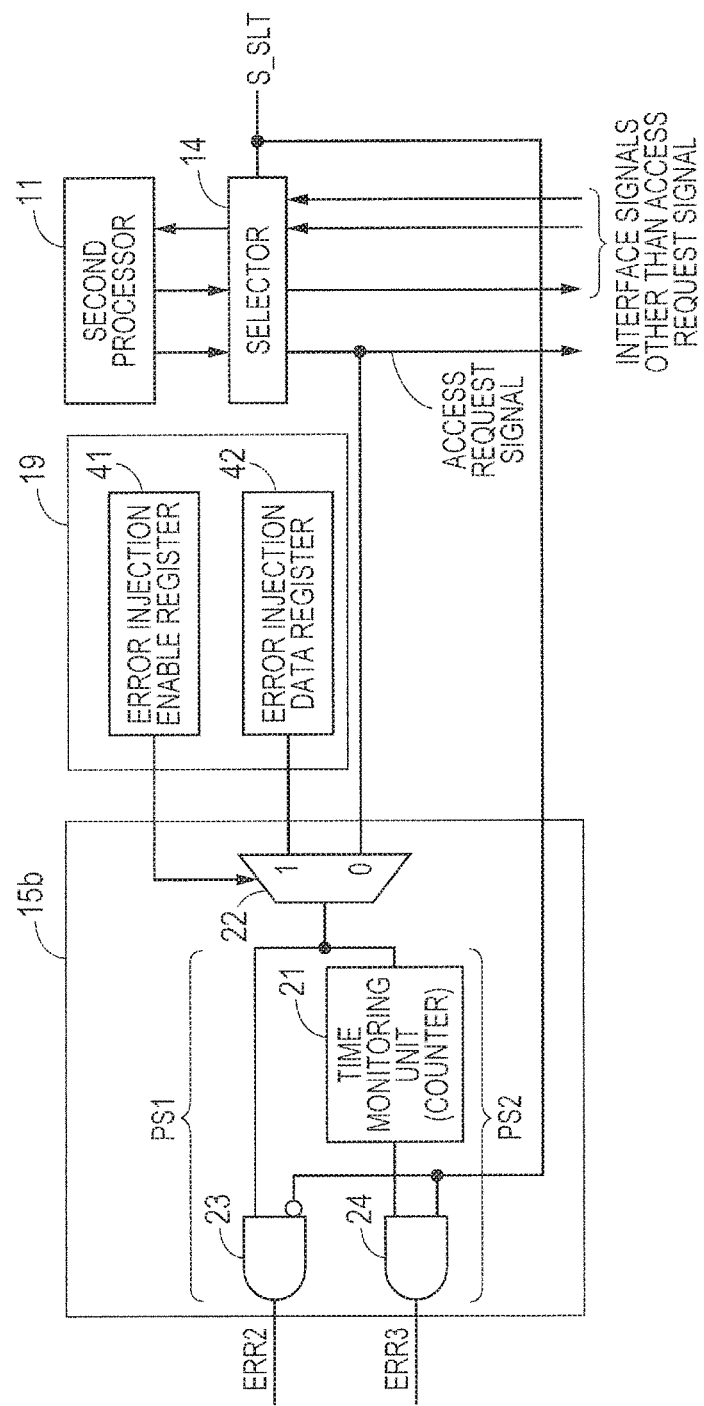
FIG. 7 is a block diagram showing an error injection unit and an access monitor according to the third embodiment.

FIG. 6 is a block diagram of the semiconductor device 3 of the third embodiment. As shown in FIG. 6, the semiconductor device 3 of the third embodiment is equivalent to the semiconductor device 1 of the first embodiment with the access monitor 15 replaced by an access monitor 15b. In the semiconductor device 3 of the third embodiment, the split mode enable signal S_SLT is inputted to the comparator 13. In the following, the access monitor 15b will be described in detail. FIG. 7 is a block diagram showing the error injection unit 19 and the access monitor 15b of the third embodiment.

As shown in FIG. 7, the access monitor 15b is equivalent to the access monitor 15a added with the AND circuits 23 and 24. The AND circuit 23 is a first gating circuit which either enables or disables the first path PS1 in accordance with the split mode enable signal S_SLT. The AND circuit 24 is a second gating circuit which either enables or disables the second path PS2 in accordance with the split mode enable signal S_SLT. Of the two input terminals of the AND circuit 23, the one for inputting the split mode enable signal S_SLT becomes active (e.g., set to high level) when the split mode enable signal S_SLT is at low level. Of the two input terminals of the AND circuit 24, on the other hand, the one for inputting the split mode enable signal S_SLT becomes active when the split mode enable signal S_SLT is at high level. That is, the AND circuits 23 and 24 are each exclusively enabled or disabled.

In the semiconductor device 3 of the third embodiment provided with the AND circuits 23 and 24 as described above, in lock-step mode, the second path PS2 is disabled to prevent the third error signal ERR3 from being enabled and, in split mode, the first path PS1 is disabled to prevent the second error signal ERR2 from being enabled.

Also, in the semiconductor device 3 of the third embodiment, when the split mode enable signal S_SLT is inputted to the comparator 13, the comparator 13 is stopped in split mode.

As described above, in the semiconductor device 3 of the third embodiment, by using the AND circuits 23 and 24, the path through which pseudo errors are generated in each mode is disabled and, thereby, pseudo-error generation is inhibited. Therefore, in the third embodiment, the need to perform processing concerning pseudo errors in the error control unit 16 is eliminated. Also, in the third embodiment, the operating time of the comparator 13 can be reduced and, thereby, the power consumption can be reduced.

Fourth Embodiment

As a fourth embodiment of the present invention, a semiconductor device 4 different from the semiconductor device 3 of the third embodiment will be described. In describing the fourth embodiment, constituent elements identical to those described in connection with the first to third embodiments will be denoted by numerals and symbols identical to those used in connection with the first to third embodiments and description of such constituent elements will be omitted.

Figure 8:
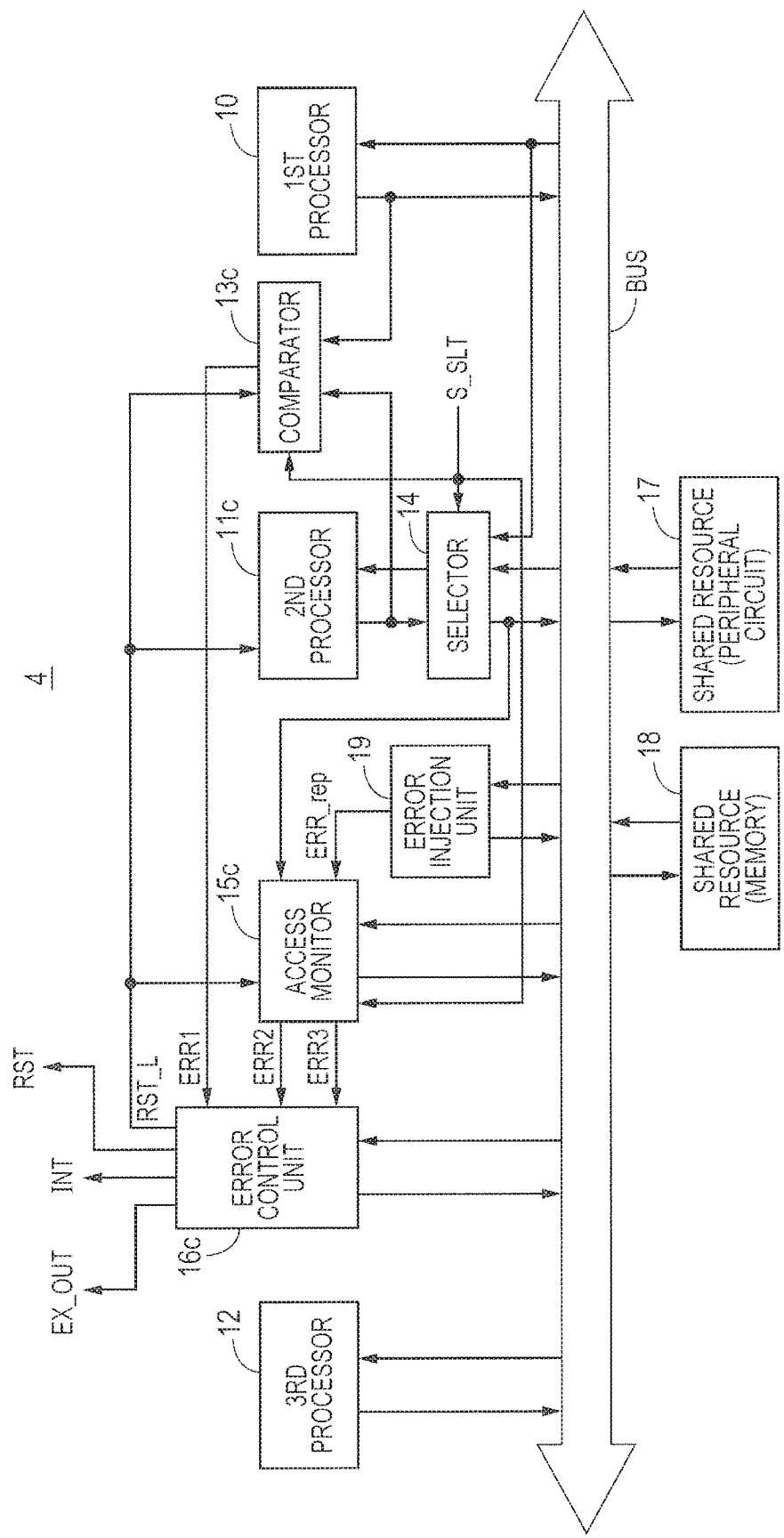
FIG. 8 is a block diagram of a semiconductor device according to a fourth embodiment of the present invention.

FIG. 8 is a block diagram showing the semiconductor device 4 of the fourth embodiment. As shown in FIG. 8, the semiconductor device 4 of the fourth embodiment is equivalent to the semiconductor device 3 of the third embodiment with the second processor 11, comparator 13, access monitor 15b and error control unit 16 replaced by the second processor 11c, comparator 13c, access monitor 15c and error control unit 16c.

The error control unit 16c compared with the error control unit 16 has an additional function in which, when an error is detected based on the first to third error signals ERR1 to ERR3, a local reset signal RST_L for operation initialization is outputted to each of the second processor 11c, comparator 13c and access monitor 15c. The second processor 11c, comparator 13c and access monitor 15c compared with the second processor 11, comparator 13 and access monitor 15b each have an additional function in which resetting can be executed based on the local reset signal RST_L.

In the semiconductor device 4 of the fourth embodiment, by resetting the second processor 11c and the comparator 13c, unwanted access to the shared resources 17 and 18 by the second processor 11 or generation of pseudo errors by the comparator 13c and access monitor 15c is inhibited. This allows, in the semiconductor device 4 of the fourth embodiment, the first processor 10 and the third processor 12 to continue operation. The first processor 10 and the third processor 12 can continue operation having been informed by an interrupt notification from the error control unit 16c that the second processor 11, comparator 13c and access monitor 15c are in a reset state.

Fifth Embodiment

As a fifth embodiment of the present invention, an access monitor 15d different from the access monitor 15 of the first embodiment will be described. In describing the fifth embodiment, constituent elements identical to those described in connection with the first embodiment will be denoted by numerals and symbols identical to those used in connection with the first embodiment and description of such constituent elements will be omitted.

Figure 9:
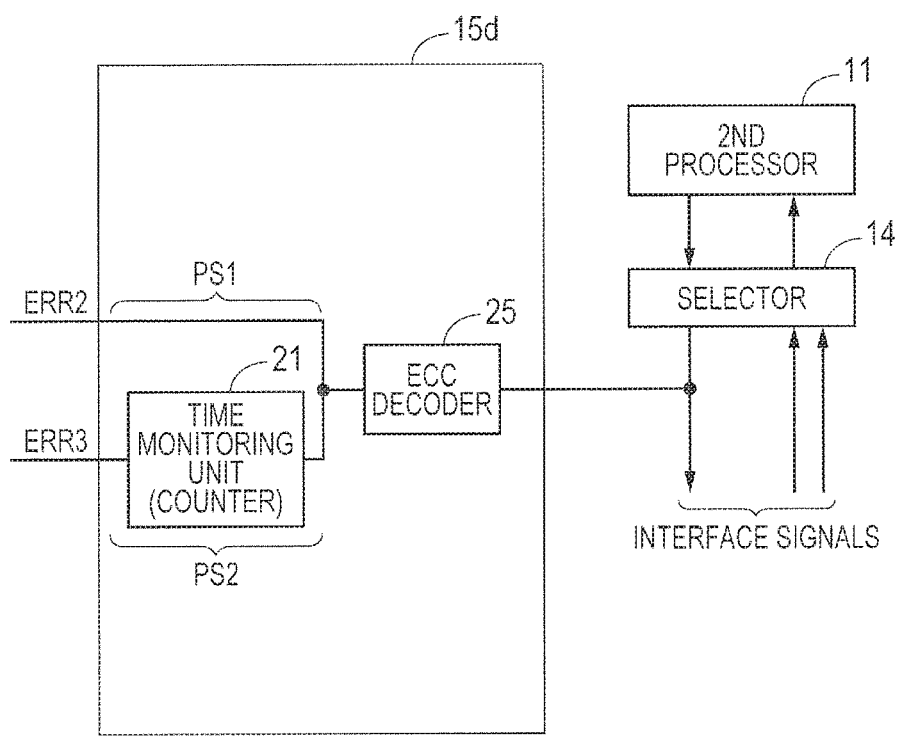
FIG. 9 is a block diagram showing an access monitor according to a fifth embodiment of the present invention.

FIG. 9 is a block diagram showing the access monitor 15d of the fifth embodiment. As shown in FIG. 9, the access monitor 15d is equivalent to the access monitor 15 added with an ECC decoder 25. The ECC decoder 25 detects, based on the monitoring target signal included in the second group of interface signals and the ECC code added to the monitoring target signal, erroneous fixation of the monitoring target signal outputted via the selector in lock-step mode. The access monitor 15d sends the output from the ECC decoder 25 to the first path PS1 and the second path PS2. As for the monitoring target signal outputted from the selector 14 and the ECC code added to the monitoring target signal, the two are preferably combined such that failure of the selector 14 is detected in decoding processing performed at the ECC decoder 25.

In the semiconductor device of the fifth embodiment, with the ECC decoder 25 provided, not only a signal having a known value, for example, an access request signal but also a signal such as a data signal whose value is updated every time the signal is generated can be used. This is because, even though when the selector 14 fails in lock-step mode, the state of one of the signals outputted via the selector 14 is fixed, in the semiconductor device of the fifth embodiment in which decoding is performed using an error detection code like the ECC code, an erroneous signal fixation can be detected even when the interface signals are those whose values are updated every time the signals are generated.

Sixth Embodiment

As a sixth embodiment of the present invention, a semiconductor device 6 different from the semiconductor device 1 of the first embodiment will be described. In describing the sixth embodiment, constituent elements identical to those described in connection with the first embodiment will be denoted by numerals and symbols identical to those used in connection with the first embodiment and description of such constituent elements will be omitted.

Figure 10:
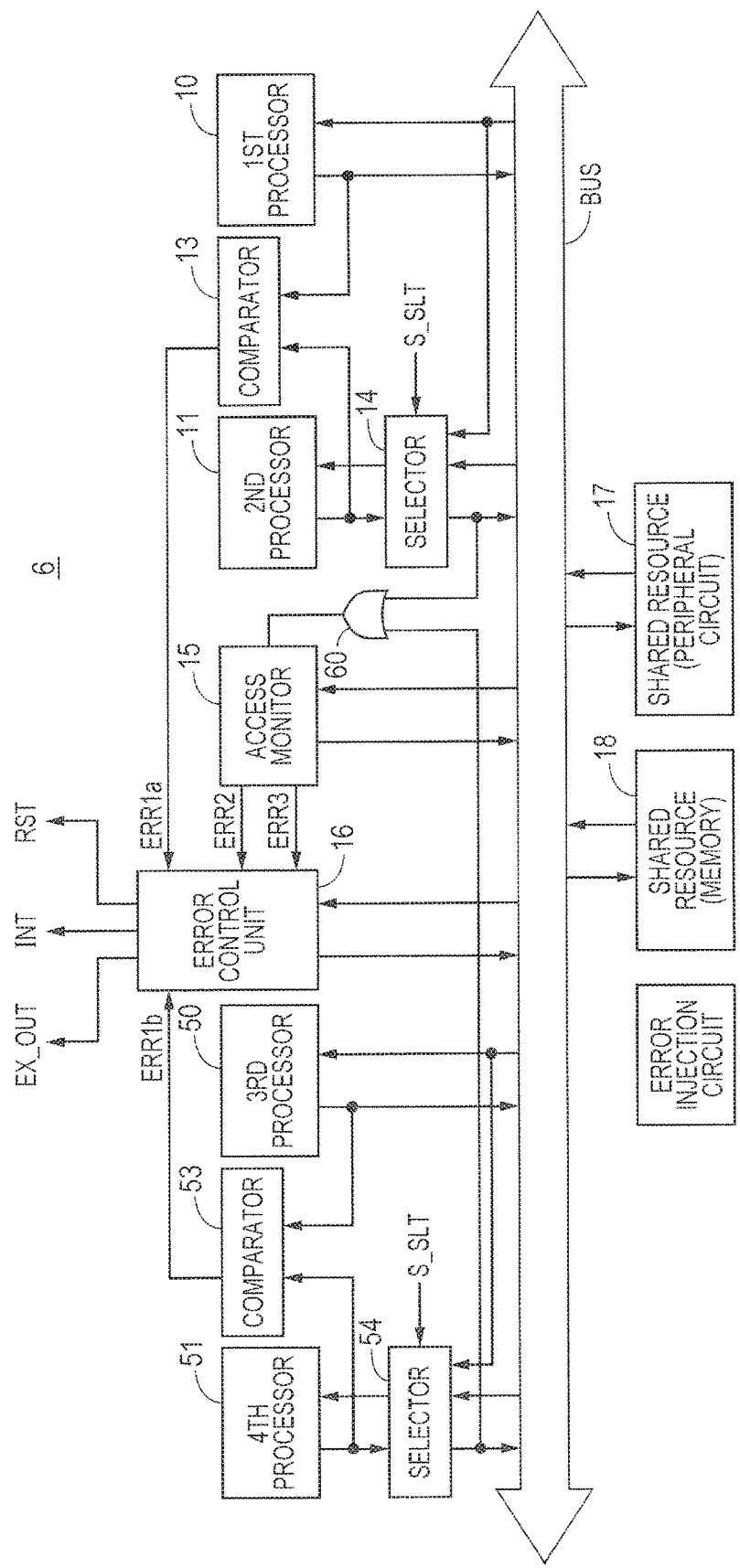
FIG. 10 is a block diagram of a semiconductor device according to a sixth embodiment of the present invention.

FIG. 10 is a block diagram of the semiconductor device 6 of the sixth embodiment. As shown in FIG. 10, the semiconductor device 6 of the sixth embodiment includes two configurations each being capable of operation mode switching between lock-step mode and split mode. In the example shown in FIG. 10, the first processor 10, second processor 11, comparator 13 and selector 14 make up a first lock-step configuration and the third processor 50, fourth processor 51, comparator 53 and selector 54 make up a second lock-step configuration. The semiconductor device 6 of the sixth embodiment is provided with, as an additional circuit, an arbitration circuit (e.g., an OR circuit). The OR circuit 60 arbitrates between the second group of interface signals outputted via the selector 14 and the fourth group of interface signals outputted from the fourth processor 51 via the selector 54 and sends a group of interface signals outputted via a selector to the access monitor 15.

In the semiconductor device 6 of the sixth embodiment, the OR circuit 60 makes it possible to monitor operations of the two lock-step configurations using a combination of the access monitor 15 and the error control unit 16. Hence, in the semiconductor device 6 of the sixth embodiment, the circuit area per lock-step configuration occupied by the access monitor 15 and the error control unit 16 is reduced.

Seventh Embodiment

As a seventh embodiment of the present invention, a semiconductor device 7 different from the semiconductor device 1 of the first embodiment will be described. In describing the seventh embodiment, constituent elements identical to those described in connection with the first embodiment will be denoted by numerals and symbols identical to those used in connection with the first embodiment and description of such constituent elements will be omitted.

Figure 11:
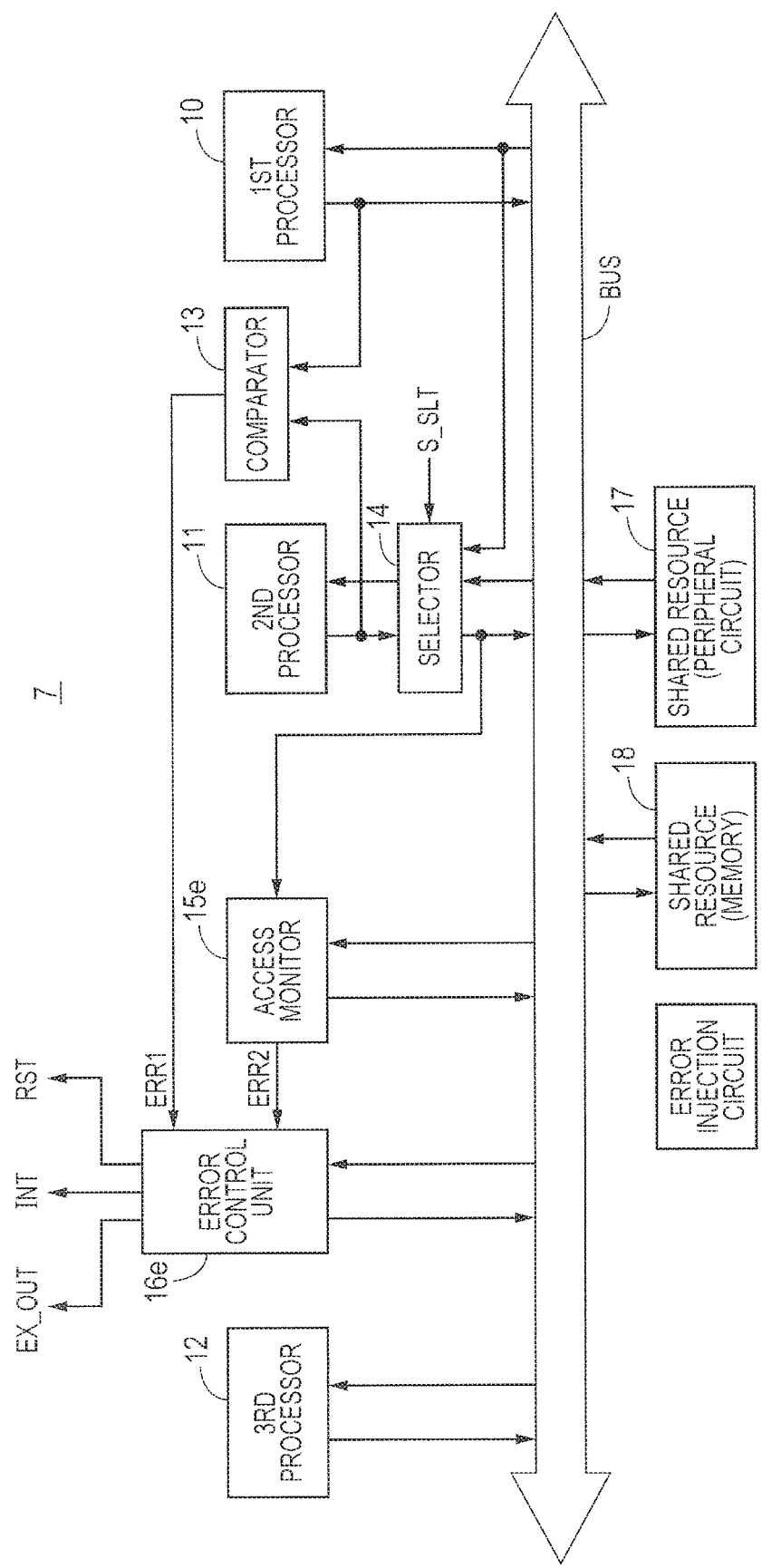
FIG. 11 is a block diagram of a semiconductor device according to a seventh embodiment of the present invention.

FIG. 11 is a block diagram of the semiconductor device 7 of the seventh embodiment. As shown in FIG. 11, the semiconductor device 7 of the seventh embodiment includes an access monitor 15e and an error control unit 16e instead of the access monitor 15 and the error control unit 16.

The access monitor 15e checks for a monitoring target signal included in the second group of interface signals outputted to the system bus BUS via the selector 14 and, when the monitoring target signal is outputted to the system bus BUS, outputs the second error signal ERR2. The error control unit 16e detects, based on the first error signal ERR1 and the second error signal ERR2, an abnormal state of the first processor 10 or the second processor 11 or the selector 14, then, based on the detected abnormal state, outputs an abnormal state processing request (e.g., a reset request signal RST, an error interrupt signal INT, or an external error notification signal EX_OUT) to a higher-order system, thereby, requesting the higher-order system to perform processing to deal with the detected abnormal state.

The access monitor 15e and the error control unit 16e will be described in detail. FIG. 12 is a block diagram showing the access monitor 15e and the error control unit 16e of the seventh embodiment. As shown in FIG. 12, the access monitor 15e is different from the access monitor 15 in that the time monitoring unit 21 and the second path PS2 are not present. The error control unit 16e is different form the error control unit 16 in that the register 33, AND circuit 34 and OR circuit 35 are not present. The access monitor 15e of the seventh embodiment monitors, in lock step mode, a monitoring target signal which is a signal having a predetermined value in a normal state with the value changing when an abnormal state is caused by a failure of the selector. In the example shown in FIG. 12, the access monitor 15e monitors, as a monitoring target signal, the access request signal outputted from the second processor 11 to request access to the shared resources 17 and 18. In lock-step mode, the access request signal is kept at low level by the selector 14, but, when the selector 14 fails, may rise to high level depending on the operation of the second processor 11. When, in lock-step mode, the access request signal outputted from the selector 14 rises to high level, the access monitor 15e sends the second error signal ERR2 to the error control unit 16e to notify the occurrence of an error.

The semiconductor device 7 of the seventh embodiment is different from the semiconductor device 1 of the first embodiment in that the error detection function in split mode is eliminated. Relatively serious failures such as access concentration to shared resources (or access collisions) occur in lock-step mode. Therefore, by employing the semiconductor device 7 of the seventh embodiment depending on the device specifications involved, such circuits as the time monitoring unit 21 and the register 33 can be omitted to reduce the circuit area.

The invention made by the present inventors has been concretely described based on embodiments, but the present invention is not limited to the foregoing embodiments and can be modified in various ways without departing from the scope of the invention.

What is claimed is:

1. A semiconductor device comprising:
   a first arithmetic core;
   a second arithmetic core;
   a shared resource for shared use by the first arithmetic core and the second arithmetic core;
   a system bus through which signals are exchanged between 1) the shared resource and 2) the first and second arithmetic cores;
   a comparator;
   a selector disposed between the second arithmetic core and the system bus;
   an access monitor; and
   an error control unit, wherein the semiconductor device has 1) a lock-step mode in which the first and second arithmetic cores operate identically to one another and 2) a split mode in which the first and second arithmetic cores operate differently from one another, wherein, in the lock-step mode, the comparator 1) compares a first group of interface signals outputted from the first arithmetic core to the shared resource with a second group of interface signals outputted from the second arithmetic core to the shared resource, and 2) when the first group of interface signals and the second group of interface signals do not agree, enables a first error signal, wherein the selector 1) prevents the second group of interface signals from being outputted to the system bus in the lock-step mode and 2) allows the second group of interface signals to be outputted to the system bus in the split mode, wherein the access monitor 1) checks for a monitoring target signal included in the second group of interface signals outputted to the system bus via the selector, 2) outputs a second error signal when the monitoring target signal is outputted to the system bus in the lock-step mode, and 3) outputs a third error signal when the monitoring target signal is not outputted for a predetermined period of time in the split mode, and wherein the error control unit 1) detects an abnormal state of the first arithmetic core, the second arithmetic core, or the selector based on the first error signal, the second error signal, and the third error signal, and 2) outputs an abnormal state processing request based on the detected abnormal state.

2. The semiconductor device according to claim 1, wherein the access monitor monitors, out of the second group of interface signals, an access request signal having a known value.

3. The semiconductor device according to claim 1, wherein the access monitor includes:
a first path through which a value of the monitoring target signal as the second error signal is output to the error control unit; and
a second path which has a counter provided therealong, the counter being operated according to the value of the monitoring target signal, and outputs the third error signal whose logic level changes when the counter overflows to the error control unit.

4. The semiconductor device according to claim 3, wherein the counter undergoes the overflow when, after a logical level change of the monitoring target signal from a first logical level to a second logical level, the second logical level is maintained beyond a predetermined period of time.

5. The semiconductor device according to claim 3, comprising:
an error injection data register storing a value of the monitoring target signal, the value being for causing the error control unit to output the abnormal processing request; and
an error injection enable register storing a switching setting value for switching whether to input the value stored in the error injection data register to the first path and the second path,
wherein the access monitor further includes a selector which selects, according to the switching setting value, either one of the value stored in the error data injection register and the monitoring target signal and outputs the selected value or signal to the first path and the second path.

6. The semiconductor device according to claim 3,
wherein the access monitor includes an ECC decoder which, using the monitoring target signal included in the second group of interface signals and an ECC code added to the monitoring target signal, detects an erroneous fixation of the monitoring target signal outputted via the selector in the lock-step mode, and
wherein the semiconductor device outputs an output of the ECC decoder to the first path and the second path.

7. The semiconductor device according to claim 3, wherein the access monitor includes:
a first gating circuit which, based on a split mode enable signal specifying switching between the lock-step mode and the split mode, either enables or disables the first path; and
a second gating circuit which, based on the split mode enable signal, either enables or disables the second path, the first gating circuit and the second gating circuit exclusively enabling or disabling the first path and the second path, respectively.

8. The semiconductor device according to claim 1, wherein the error control unit includes:
a first register storing a first error value for notifying an error state made known by the second error signal; and
a second register storing a second error value for notifying an error state made known by the third error signal, and
wherein when the value stored in the first register is inputted as the second error signal, or when the value stored in the second register is inputted as the third error signal, the error control unit outputs the abnormal state processing request.

9. The semiconductor device according to claim 1, wherein the error control unit, when an error is detected according to the first, second or third error signal, outputs a local reset signal for initializing operations of the first arithmetic core, the comparator and the access monitor.

10. The semiconductor device according to claim 1, wherein the selector is used as a first selector, the semiconductor device comprising:
a third arithmetic core and a fourth arithmetic core which access the shared resource via the system bus and which can operate in the lock-step mode and the split mode;
a second selector which, in the lock-step mode, prevents a fourth group of interface signals outputted from the fourth arithmetic core for input to the shared resource from being outputted to the system bus and, in the split mode in which the third arithmetic core and the fourth arithmetic core operate differently, sends the fourth group of interface signals to the system bus; and
an arbitration circuit which arbitrates between the second group of interface signals outputted via the first selector for input to the system bus and the fourth group of interface signals outputted via the second selector for input to the system bus and outputs a group of interface signals to the access monitor.

11. A semiconductor device, comprising:
a first arithmetic core;
a second arithmetic core;
a shared resource for shared use by the first arithmetic core and the second arithmetic core;
a system bus through which signals are exchanged between the first and second arithmetic cores and the shared resource;
a comparator;

a selector disposed between the second arithmetic core and the system bus;

an access monitor; and an error control unit, wherein the semiconductor device has 1) a lock-step mode in which the first and second arithmetic cores identically operate and 2) a split mode in which the first and second arithmetic cores operate differently, wherein, in the lock-step mode, the comparator 1) compares a first group of interface signals outputted from the first arithmetic core to the shared resource with a second group of interface signals outputted from the second arithmetic core to the shared resource, and 2) when the first group of interface signals and the second group of interface signals do not agree, enables a first error signal, wherein the selector 1) prevents the second group of interface signals from being outputted to the system bus in the lock-step mode and 2) sends the second group of interface signals to the system bus in the split mode, wherein the access monitor 1) checks for a monitoring target signal included in the second group of interface signals outputted to the system bus via the selector and 2) outputs a second error signal when the monitoring target signal is outputted to the system bus in the lock-step mode, wherein the error control unit 1) detects an abnormal state of the first arithmetic core, the second arithmetic, core or the selector based on the first error signal and the second error signal, and 2) outputs an abnormal state processing request based on the detected abnormal state, and wherein, in the lock-step mode, the monitoring target signal has a predetermined value in a normal state, the predetermined value changing in an abnormal state caused when the selector fails.

12. The semiconductor device according to claim 11, wherein the monitoring target signal is an access request signal outputted when the second arithmetic core requests access to the shared resource.

* * * * *